US012578636B2

(12) United States Patent
Raschke et al.

(10) Patent No.: US 12,578,636 B2
(45) Date of Patent: Mar. 17, 2026

(54) RETICLE POD HAVING RETENTION THROUGH RETICLE COMPARTMENT WALL

(71) Applicant: ENTEGRIS, INC., Billerica, MA (US)

(72) Inventors: Russ V. Raschke, Chanhassen, MN (US); Pierce Laing, Orono, MN (US); Anthony M. Tieben, Belle Plaine, MN (US)

(73) Assignee: ENTEGRIS, INC., Billerica, MA (US)

( * ) Notice: Subject to any disclaimer, the term of this patent is extended or adjusted under 35 U.S.C. 154(b) by 836 days.

(21) Appl. No.: 17/790,071

(22) PCT Filed: Dec. 9, 2020

(86) PCT No.: PCT/US2020/064067
§ 371 (c)(1),
(2) Date: Jun. 29, 2022

(87) PCT Pub. No.: WO2021/138012
PCT Pub. Date: Jul. 8, 2021

(65) Prior Publication Data
US 2023/0038768 A1 Feb. 9, 2023

Related U.S. Application Data

(60) Provisional application No. 62/955,619, filed on Dec. 31, 2019.

(51) Int. Cl.
*G03F 1/66* (2012.01)
*H01L 21/673* (2006.01)

(52) U.S. Cl.
CPC .......... *G03F 1/66* (2013.01); *H01L 21/67353* (2013.01); *H01L 21/67359* (2013.01); *H01L 21/67369* (2013.01)

(58) Field of Classification Search
CPC ................. G03F 1/66; H01L 21/67359; H01L 21/67369; H01L 21/67353
See application file for complete search history.

(56) References Cited

U.S. PATENT DOCUMENTS

| | | | | |
|---|---|---|---|---|
| 6,900,878 B2 * | 5/2005 | Okubo | ................ | G03F 7/70741 |
| | | | | 414/931 |
| 8,220,630 B1 * | 7/2012 | Ku | ............................ | G03F 1/66 |
| | | | | 206/454 |

(Continued)

FOREIGN PATENT DOCUMENTS

| | | |
|---|---|---|
| CN | 102789132 A | 11/2012 |
| JP | H1010705 A | 1/1998 |

(Continued)

*Primary Examiner* — Hung V Nguyen

(57) ABSTRACT

A reticle pod includes an outer portion that includes a pod door and a pod dome, and an inner portion including a baseplate and a cover. One of the baseplate or the cover includes a reticle compartment wall extending towards the other of the baseplate or cover. The reticle compartment wall includes one or more retaining features. The pod door or the pod dome includes one or more actuating surfaces configured to contact the retaining features. The retaining features are configured to be moved by contact with the actuating surfaces. The retaining features may be in a position configured to secure a reticle within the inner portion of the reticle pod when the reticle pod is assembled by joining the baseplate and the cover, placing the joined baseplate and cover within the pod dome, and securing the pod door to the pod dome.

13 Claims, 3 Drawing Sheets

(56)  References Cited

U.S. PATENT DOCUMENTS

| | | | | |
|---|---|---|---|---|
| 8,403,143 B2 * | 3/2013 | Chiu | ................. | H01L 21/67353 |
| | | | | 206/724 |
| 9,745,119 B2 | 8/2017 | Kolbow | | |
| 11,837,486 B2 * | 12/2023 | Lee | ................... | H01L 21/67733 |
| 2004/0057030 A1 | 3/2004 | Okubo | | |
| 2005/0134831 A1 | 6/2005 | Wiseman | | |
| 2006/0120840 A1 | 6/2006 | Chiu et al. | | |
| 2008/0041760 A1 | 2/2008 | Durben et al. | | |
| 2008/0160235 A1 | 7/2008 | Wu | | |
| 2012/0175279 A1 | 7/2012 | Kuku et al. | | |
| 2013/0126378 A1 | 5/2013 | Ku | | |

FOREIGN PATENT DOCUMENTS

| | | | | | |
|---|---|---|---|---|---|
| JP | 2006184442 | A | 7/2006 | | |
| JP | 2010072420 | A | 4/2010 | | |
| JP | 2012186391 | A | 9/2012 | | |
| JP | 3181255 | U | 1/2013 | | |
| JP | 2014527291 | A | 10/2014 | | |
| JP | 2018120201 | A | 8/2018 | | |
| KR | 100567894 | B1 | 4/2006 | | |
| KR | 20130003817 | U | 6/2013 | | |
| TW | 201931007 | A | 8/2019 | | |
| WO | WO-2007038504 | A2 * | 4/2007 | .......... | H01L 21/673 |
| WO | 2013013849 | A1 | 1/2013 | | |
| WO | 2018044678 | A1 | 3/2018 | | |

* cited by examiner

*300*

*302*

JOIN RETICLE POD COVER TO
BASEPLATE

*304*

JOIN RETICLE POD DOOR TO POD
DOME

*306*

BRING ACTUATING SURFACES INTO
CONTACT WITH RETAINING FEATURES

*308*

MOVE RETAINING FEATURES VIA
ACTUATING SURFACES

RETICLE POD HAVING RETENTION THROUGH RETICLE COMPARTMENT WALL

CROSS-REFERENCE TO RELATED APPLICATION

This application is the U.S. National Stage of International Application No. PCT/US2020/064063, filed Dec. 9, 2020, which claims the benefit of and priority to U.S. Provisional Application No. 62/953,326, filed on Dec. 24, 2019, which is incorporated by reference herein in its entirety for all purposes.

TECHNICAL FIELD

This disclosure generally relates to reticle pods for storing and transporting a reticle. More particularly, this disclosure is directed to reticle pods including movable retention features extending through reticle compartment walls of an inner pod for retaining the reticle contained therein.

BACKGROUND

Reticle pods are used for storage and transport of reticles as well as processing, particularly transport of the reticles to and from processing tools such as photolithography devices. Reticle pods include, for example, Extreme Ultraviolet (EUV) pods for use with EUV photolithography tools. Reticle pods reduce or prevent contamination or physical damage to the reticles contained therein during movement, handling, and processing of the reticles. Reticle pods may include an outer pod and an inner pod within the outer pod. The inner pod may include a baseplate and a cover, which contain the reticle, and an outer pod including a pod door and a pod dome, which contains the inner pod.

SUMMARY

This disclosure is directed to reticle pods including movable retention features extending through reticle compartment walls of an inner pod for retaining the reticle contained therein.

Movable retention features allow a reticle to be securely positioned within a reticle pod, and thus less susceptible to shocks during handling or transit. Retention features through reticle compartment walls of an inner pod of the reticle pod allow the reticle to be properly placed within the pod without interference from security features prior to final closure of the reticle pod, and secured when the pod is closed for transport, storage, or processing.

In an embodiment, a reticle pod includes an inner portion including a cover and a baseplate. One of the cover and the baseplate includes a reticle compartment wall extending from that one of the cover and the baseplate, the reticle compartment wall including one or more retaining features. The reticle pod includes an outer portion including a pod dome and a pod door. One of the pod dome and the pod door includes one or more actuating surfaces configured to contact at least one of the one or more retaining features when the cover is joined to the baseplate, the pod dome being joined to the pod door, and the joined cover and baseplate being within the joined pod dome and pod door. When the one or more actuating surfaces contact the one or more retaining features, the retaining features are configured to be positioned such that they contact a reticle when the reticle is located within the joined cover and baseplate.

In an embodiment, each of the one or more retaining features is linearly movable in a direction having a component at an angle ranging from zero to ninety degrees to a plane of the reticle compartment wall.

In an embodiment, each of the one or more retaining features includes a spring. In an embodiment, when the spring is in a resting position, the retaining feature is in a position farther from a center of the baseplate than when the retaining feature is contacted by one of the one or more actuating surfaces.

In an embodiment, each of the one or more retaining features is linearly movable in a direction having an angle ranging from zero to ninety degrees to a plane of the reticle compartment wall.

In an embodiment, each of the one or more retaining features includes a contact surface configured to engage a curved or beveled edge.

In an embodiment, each of the one or more actuating surfaces is a surface configured to slide against an end of at least one of the one or more retaining features.

In an embodiment, each of the one or more actuating surfaces extends from the pod dome.

In an embodiment, each of the one or more retaining features include a first end located on a first side of the reticle compartment wall and a second end on a second side of the reticle compartment wall, the second side of the reticle compartment wall opposite the first side of the reticle compartment wall, and the one or more retaining features are each rotatable about an axis in plane with a plane of the reticle compartment wall.

In an embodiment, each of the one or more actuating surfaces is a projection extending from the pod door.

In an embodiment, each of the one or more actuating surfaces contacts at least one of the one or more retaining features at the second end, the first end of each of the one or more retaining features contacts the reticle.

In an embodiment, each of the one or more retaining features includes a thermoplastic material.

In an embodiment, the reticle compartment wall extends from the baseplate.

In an embodiment, the reticle compartment wall extends from the cover.

In an embodiment, a method of manipulating one or more retaining features includes joining a cover to the baseplate, wherein one of the cover and the baseplate includes a reticle compartment wall extending from that one of the cover and the baseplate, placing the joined cover and baseplate in a pod dome. The method further includes joining a pod door to the pod dome. Joining the pod door to the pod dome includes bringing one or more actuating surfaces into contact with one or more retaining features located on the reticle compartment wall. The method further includes moving the one or more retaining features via the contact with the one or more actuating surfaces.

In an embodiment, moving the one or more retaining features comprises linear movement of the one or more retaining features inwards into a space defined by the reticle compartment wall.

In an embodiment, the one or more actuating surfaces are located on the cover and configured to slide against an end of at least one of the one or more retaining features.

In an embodiment, moving the one or more retaining features comprises rotational movement of the one or more retaining features about an axis in plane with a plane of the reticle compartment wall.

In an embodiment, the one or more actuating surfaces are projections extending from the pod door.

In an embodiment, the reticle compartment wall extends from the cover.

BRIEF DESCRIPTION OF THE DRAWINGS

The disclosure may be more completely understood in consideration of the following description of various illustrative embodiments in connection with the accompanying drawings.

Figure 1:
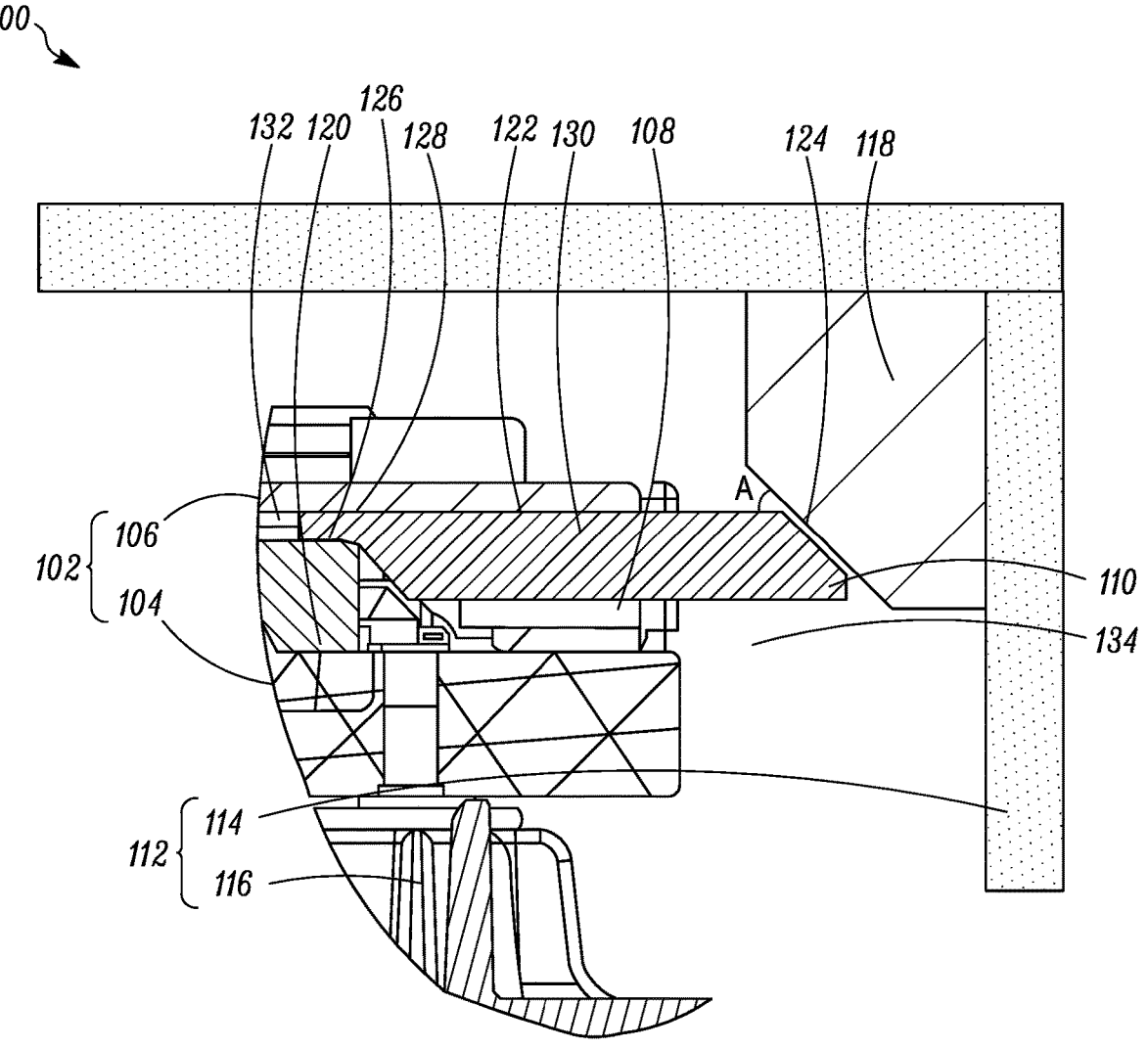
FIG. 1 shows a sectional view of a reticle pod, according to an embodiment.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DETAILED DESCRIPTION

The following detailed description should be read with reference to the drawings in which similar elements in different drawings are numbered the same. The detailed description and the drawings, which are not necessarily to scale, depict illustrative embodiments and are not intended to limit the scope of the disclosure. The illustrative embodiments depicted are intended only as exemplary. Selected features of any illustrative embodiment may be incorporated into an additional embodiment unless clearly stated to the contrary.

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The term "about" generally refers to a range of numbers that is considered equivalent to the recited value (e.g., having the same function or result). In many instances, the term "about" may include numbers that are rounded to the nearest significant figure.

This disclosure generally relates to reticle pods for storing and transporting a reticle used in a photolithography processing steps. More particularly, this disclosure is directed to reticle pods including movable retention features extending through reticle compartment walls of an inner pod for retaining the reticle contained therein.

FIG. 1 shows a sectional view of a reticle pod 100, according to an embodiment. Reticle pod 100 includes inner portion 102, which includes baseplate 104 and cover 106. In the embodiment shown in FIG. 1, cover 106 includes reticle compartment wall 108. Reticle compartment wall 108 includes a reticle retainer 110. Reticle pod 100 also includes outer portion 112, which includes pod dome 114 and pod door 116. In the embodiment shown in FIG. 1, pod dome 114 includes an actuating surface 118.

Reticle pod 100 is a pod configured to store a reticle and transport a reticle between different photolithography processing steps. The reticle is, for example, a photolithography mask for a semiconductor wafer.

Inner portion 102 is part of reticle pod 100 in which the reticle may be placed. The inner portion 102 includes an internal space 132 defined by baseplate 104 and cover 106. The internal space 132 may be sized such that it can accommodate the reticle. One or both of the components of inner portion 102, cover 104 and baseplate 106, may include a metal or alloy, such as aluminum or another such suitable material.

Baseplate 104 is part of the inner portion 102 of reticle pod 100. When reticle pod 100 is assembled, baseplate 104 may be supported by pod door 116. The baseplate 104 may form the lower part of the inner portion 102 of reticle pod 100. The baseplate 104 may be configured such that a reticle may rest on baseplate 104.

Baseplate 104 may include one or more reticle contacts 120. In an embodiment, reticle contacts 120 are fixed to the inside of the baseplate 104 such that they face the cover 106 when the inner portion 102 of reticle pod 100 is assembled. In an embodiment, reticle contacts 120 are fixed in position via a mechanical connection, such as insertion of a portion of reticle contact 120 into baseplate 104. In an embodiment, reticle contacts 120 are formed integrally in baseplate 104. In an embodiment, there are at least three reticle contacts 120 formed in or attached to baseplate 104. In an embodiment, there are four reticle contacts 120 formed in or attached to baseplate 104. In an embodiment, reticle contacts 120 are located at positions on the baseplate corresponding to the corners of the internal space 132 of inner portion 102. Reticle contacts 120 include a material compatible with the reticle material. Compatible materials include materials that provide minimal or no particle generation when in contact with the reticle material, and which cannot scratch or otherwise damage the reticle. In an embodiment, the compatible material is a polymer material. Reticle contacts 120 may include the compatible material at least at a contact point configured to contact a reticle when reticle pod 100 is assembled. In an embodiment, the reticle contacts 120 are entirely made of a polymer material suitable for contacting the reticle. Suitable polymer materials include, for example, polyether-ether-ketone (PEEK), a polyaryl-ether-ketone (PAEK), polyethylenimine (PEI), polyamide-imide (PAI), or conductive polymers.

Cover 106 is another part of the inner portion 102 which is configured to be joined with baseplate 104. Cover 106 may form an upper part of the inner portion 102. Cover 106 may include features that are matching or mechanically compatible with baseplate 104. In the embodiment shown in FIG. 1, cover 106 includes reticle compartment wall 108 extending from a surface of cover 106.

In the embodiment shown in FIG. 1, reticle compartment wall 108 extends from cover 106. Reticle compartment wall 108 extends from a surface of cover 106 facing the baseplate 104 when the cover 106 and baseplate 104 are assembled to form the inner portion 102. Reticle compartment wall 108 may define a perimeter of the internal space 132 of inner portion 102 that is configured to accommodate a reticle. In an embodiment, reticle compartment wall 108 includes one or more through holes 122. A reticle retainer 110 may extend through a through hole 122. Reticle retainer 110 may further be connected to reticle compartment wall 108 via a spring, for example a metal spring, a resilient material such as an elastic polymer, or other such suitable resilient connection of reticle compartment wall 108 to the reticle retainer 110. In an embodiment, the connection of the reticle retainer 110 and the reticle compartment wall 108 may be a metal spring extending into the through hole 122.

Reticle retainer 110 extends through reticle compartment wall 108 at through hole 122. Reticle retainer 110 is linearly movable. In a portion of the range of linear motion of reticle retainer 110, it may contact a reticle when the reticle is placed within the inner portion 102 of the reticle pod 100. Multiple reticle retainers 110 may be distributed along the reticle compartment wall 108. In an embodiment, the reticle compartment wall 108 forms a square, and at least one reticle retainer 110 is disposed on each side of that square. In an embodiment, reticle compartment wall 108 forms a square, and at least two reticle retainers 110 are disposed on each side of that square. In an embodiment, the reticle retainers 110 on each side of the shape defined by reticle compartment wall 108 are opposite reticle retainers 110 on opposing sides of the shape, such that the reticle would be clamped between the opposing reticle retainers 110. Reticle retainer 110 is configured to, when contacting the reticle, limit or prevent movement of the reticle within the inner portion of reticle pod 100 when reticle pod 100 experiences movement, such as during movement and handling of the reticle pod 100, or during shock events such as dropping or hitting the reticle pod 100.

Reticle retainer 110 includes a contact surface 124 on a side of the reticle retainer 110 that is outside the reticle compartment wall 108. The contact surface 124 is configured to contact actuating surface 118. Contact surface 124 is configured such that contact of the actuating surface 118 applies a force to reticle retainer 110 including a component inwards towards the internal space 132 defined by baseplate 104 and cover 106. Contact surface 124 may have a shape complementary to the actuating surface 118, such as both contact surface 124 and actuating surface 118 being flat surfaces, or contact surface 124 having a curved surface configured to match a curved actuating surface 118. Contact surface 124 may be, for example, a flat surface that has a plane at an acute angle A with respect to the direction of movement of reticle retainer 110 through the reticle compartment wall 108.

In an embodiment, reticle retainer 110 includes an engagement surface 126 shaped to interface with a reticle. In an embodiment, the engagement surface 126 includes a flat projection configured to contact an upper surface of a reticle. In an embodiment, this upper surface is a surface opposite the surface of the reticle contacting reticle contacts 120 included in baseplate 104. In an embodiment, the engagement surface 126 includes a curved surface corresponding to a bevel or other shaping at an edge of the reticle. In an embodiment, the engagement surface 126 is provided on a section 128 of the having a cross-sectional area larger than that of the portion extending through the through hole 122.

In an embodiment, a section 130 of reticle retainer 110 extending through the through hole 122 may include at least a portion having an shape such as an oval or one or more features such as tabs or a squared-off section such that the orientation of the reticle retainer 110 is maintained with respect to the reticle compartment wall 108.

In an embodiment, the reticle retainer 110 may include one or more features on the surface to connect reticle retainer 110 to a spring or resilient material, such as a flange to be contacted by a spring or a groove configured to receive resilient material.

Outer portion 112 of reticle pod 100 is configured to enclose the inner portion 102. Outer portion 112 may include or be made entirely of polymer materials. Outer portion includes pod dome 114 and pod door 116. In an embodiment, pod dome 114 and pod door 116 are secured to one another by a latch to form the outer portion 112. In an embodiment, outer portion 112 includes an internal space 134 sized to accommodate the inner portion 102, and outer portion 112 contacts inner portion 102 while pod door 116 and pod dome 114 are secured to one another. Contact between outer portion 112 and inner portion 102 when the outer portion 112 is assembled may secure inner portion 102 within outer portion 112. This contact may be provided by one or more projections, indentations, or other such features on the pod dome 114 and pod door 116 that are on surfaces facing the internal space 134 of outer portion 112. In an embodiment, at least one of the components of outer portion 112 includes a projection that includes actuating surface 118.

Pod dome 114 is part of the outer portion 112 of reticle pod 100. Pod dome 114 may include one or more features configured to contact cover 106 when the reticle pod 100 is assembled. Pod dome 114 may further include one or more projections including one or more actuating surfaces 118. Pod dome 114 includes an internal space. The internal space may include a first internal space 134 sized to accommodate the inner portion 102 of reticle pod 100 and a second space (not shown) at an end of pod dome 114 configured to accommodate pod door 116. The second space may be defined by a lip (not shown). The portion of pod dome 114 surrounding the second space may include one or more slots or other openings configured to receive part of a latch to secured pod dome 114 to pod door 116 to form the outer portion 112 of reticle pod 100.

Pod door 116 is another part of the outer portion 112 of reticle pod 100. Pod door 116 is configured to be combined with pod dome 114 to form the outer portion 112 of the reticle pod 100. The pod door 116 may be sized such that it fits in a space of pod dome 114 such that it closes an end of pod dome 114. Pod door 116 may be joined to pod dome 114 by one or more latches. Pod door 116 may be removable from pod dome 114 when latches are not engaging pod dome 114.

In the embodiment shown in FIG. 1, actuating surface 118 is provided on a projection from pod dome 114. Actuating surface 118 may be, for example, a sliding surface configured to contact reticle retainer 110 at its contact surface 124. When actuating surface 118 contacts the reticle retainer at contact surface 124, reticle retainer 110 may be driven inwards with respect to the interior space formed by baseplate 104 and cover 106. In an embodiment, actuating surface 118 and contact surface 124 are faces of opposing wedges such that the sliding of actuating surface 118 against the contact surface 124 causes the inwards movement of reticle retainer 110.

Figure 2:
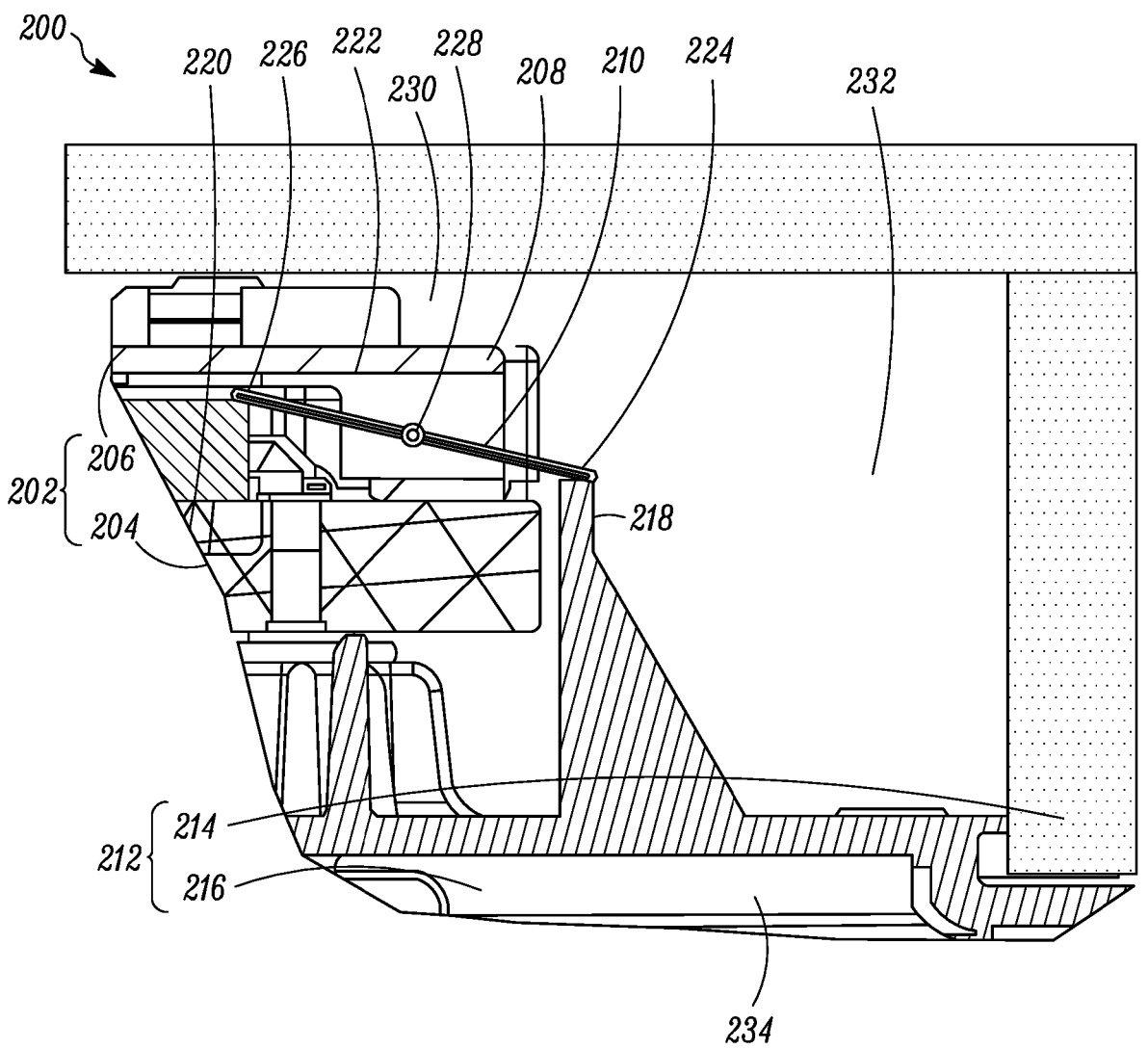
FIG. 2 shows a sectional view of a reticle pod, according to an embodiment.

FIG. 2 shows a sectional view of a reticle pod 200, according to an embodiment. Reticle pod 200 includes inner portion 202, which includes baseplate 204 and cover 206. In the embodiment shown in FIG. 2, the baseplate 204 includes reticle compartment wall 208. Reticle compartment wall 208 includes a reticle retainer 210. Reticle pod 200 also includes outer portion 212, which includes pod dome 214 and pod door 216. In the embodiment shown in FIG. 2, pod door 216 includes an actuating surface 218.

Reticle pod 200, like reticle pod 100 described above, is a pod configured to store a reticle during transportation, handling, and processing, particularly for processing such as photolithography including, for example, Extreme Ultraviolet (EUV). The reticle is, for example, a photolithography mask for a semiconductor wafer.

Inner portion 202 is part of reticle pod 200 in which the reticle may be placed. The inner portion 202 includes an internal space 230 defined by baseplate 204 and cover 206. The internal space 230 may be sized such that it can accommodate the reticle. One or both of the components of inner portion 202, cover 204 and baseplate 206, may include a metal or alloy, such as aluminum or another such suitable material.

Baseplate 204 may include one or more reticle contacts 220. In an embodiment, reticle contacts 220 are fixed to the inside of the baseplate 204 such that they face the cover 206 when the inner portion 202 of reticle pod 200 is assembled. In an embodiment, reticle contacts 220 are fixed in position by, for example a mechanical connection, such as a portion of reticle contact 220 being pressed through a hole formed in the baseplate 204. In an embodiment, reticle contacts 220 are formed integrally in baseplate 204. In an embodiment, there are at least three reticle contacts 220 formed in or attached to baseplate 204. In an embodiment, there are four reticle contacts 220 formed in or attached to baseplate 204. In an embodiment, reticle contacts 220 are located at positions on the baseplate 204 corresponding to the corners of the internal space 230 of inner portion 202. Reticle contacts 220 include a material compatible with the reticle material. Compatible materials include materials that provide minimal or no particle generation when in contact with the reticle material, and which cannot scratch or otherwise damage the reticle material. In an embodiment, the compatible material is a polymer material. Reticle contacts 220 may include the compatible material at least at a contact point configured to contact a reticle when reticle pod 200 is assembled. In an embodiment, the reticle contacts 220 are entirely made of a polymer material suitable for contacting the reticle. Suitable polymer materials include, for example, polyether-etherketone (PEEK), a polyaryl-ether-ketone (PAEK), polyethylenimine (PEI), polyamide-imide (PAI), or conductive polymers.

Cover 206 is another part of the inner portion 202 which is configured to be joined with baseplate 204. Cover 206 may form an upper part of the inner portion 202. Cover 206 may include features that are matching or mechanically compatible with baseplate 204. In the embodiment shown in FIG. 2, cover 206 includes reticle compartment wall 208 extending from a surface of cover 206.

In the embodiment shown in FIG. 2, reticle compartment wall 208 extends from cover 206. Reticle compartment wall 208 extends from a surface 234 of cover 206 facing the baseplate 204 when the cover 206 and baseplate 204 are to be assembled to form the inner portion 202. In an alternative embodiment, reticle compartment wall 208 could extend from baseplate 204 towards cover 206. Reticle compartment wall 208 may define a perimeter of the internal space 230 of inner portion 202 that is configured to accommodate a reticle. In an embodiment, reticle compartment wall 108 includes one or more through holes 222. A reticle retainer 210 may extend through a through hole 222. Through hole 222 may be, for example, circular, square, or rectangular in cross-section.

In the embodiment shown in FIG. 2, reticle retainer 210 includes a first end 224 on a first side of the reticle compartment wall 208, and a second end 226 on a second side of the reticle compartment wall 208, opposite the first. Reticle retainer 210 is attached to reticle compartment wall 208 via a hinge 228 that is located within the through hole 222. Reticle retainer 210 is sufficiently rigid such that when a force is applied to first end 224, the reticle retainer rotates about hinge 228, causing movement of second end 226. In an embodiment, reticle retainer 210 is flexible, such that when second end 226 contacts a reticle, the reticle retainer 210 can flex.

First end 224 is on side of the reticle compartment wall 208 that is outside the internal space 230 defined by the baseplate 204 and cover 206. First end 224 extends away from reticle compartment wall 208 such that it can be contacted by a feature included on part of the outer portion 212, such as pod dome 214 or pod door 216 when the inner portion 202 is located within the outer portion 212.

Second end 226 is on a side of the reticle compartment wall 208 that is inside the internal space 230 defined by the baseplate 204 and cover 206. Reticle retainer 210 is configured such that second end 226 can be rotated into a position where it would contact a reticle located within the internal space 230 defined by the baseplate 204 and cover 206. The second end 226 may be configured to contact the reticle on a surface of the reticle opposite a surface of the reticle contacting reticle contacts 220 in the baseplate 204.

Hinge 228 is a hinge joining reticle retainer 210 to reticle compartment wall 208. Hinge 228 is located within through hole 222. In an embodiment, 228 includes projections from reticle retainer 210 that are opposite one another and corresponding holes formed in the through hole 222 configured to receive the projections. In an embodiment, hinge 228 includes projections from the surface of through hole 222 that extend into the reticle retainer 210. Hinge 228 may be oriented such that the axis of rotation about hinge 228 is in plane with reticle compartment wall 208.

Outer portion 212 of reticle pod 200 is configured to enclose the inner portion 202. Outer portion 212 may include or be made entirely of polymer materials. Outer portion 212 includes pod dome 214 and pod door 216. In an embodiment, pod dome 214 and pod door 216 are secured to one another by a latch to form the outer portion 212. In an embodiment, outer portion 212 includes an internal space 232 sized to accommodate the inner portion 202, and outer portion 212 contacts inner portion 202 while pod door 216 and pod dome 214 are secured to one another. Contact between outer portion 212 and inner portion 202 when the outer portion 212 is assembled may secure inner portion 202 within outer portion 212. This contact may be provided by one or more projections, indentations, or other such features on the pod dome 214 and pod door 216 that are on surfaces facing the internal space 232 of outer portion 212. In an embodiment, at least one of the components of outer portion 212 includes a projection that includes actuating surface 218.

Pod dome 214 is part of the outer portion 212 of reticle pod 200. Pod dome 214 may include one or more features configured to contact cover 206 when the reticle pod 200 is assembled. Pod dome 214 may include internal space 232 sized to accommodate the inner portion 202 of reticle pod 200 and an opening (not shown) at an end of pod dome 214 configured to accommodate pod door 216. The opening may be defined by a lip (not shown). The portion of pod dome 214 surrounding the second space may include one or more slots or other openings configured to receive part of a latch to secured pod dome 214 to pod door 216 to form the outer portion 212 of reticle pod 200.

Pod door 216 is another part of the outer portion 212 of reticle pod 200. Pod door 216 is configured to be combined with pod dome 214 to form the outer portion 212 of the reticle pod 200. The pod door 216 may be sized such that it fits in a space of pod dome 214 such that it closes an end of pod dome 214. Pod door 216 may be joined to pod dome 214 by one or more latches. Pod door 216 may be removable from pod dome 214 when latches are not engaging pod dome 214. Pod door 216 may further include one or more projections including one or more actuating surfaces 218.

In the embodiment shown in FIG. 2, one or more actuating surfaces 218 are provided on one or more projections from pod door 216. Actuating surface 218 is configured to contact first end 224 of when the pod door 216 and pod dome 214 are joined or secured to one another. Contact between actuating surface 218 and first end 224 of reticle retainer 210 pushes the first end 224, rotating reticle retainer about hinge 228. This rotation moves second end 226 into a position where it may contact a reticle located within the inner portion 202 of reticle pod 200. Contact between the second end 226 and the reticle may secure the reticle, such as by clamping the reticle between at least a portion of second end 226 and reticle contacts 220 included in the baseplate 204. In an embodiment, actuating surface 218 can itself be actuated, for example moved to project outwards from the pod door 216 by being acted upon, such as being acted upon by a component of a latching mechanism included in the pod door 216.

Figure 3:
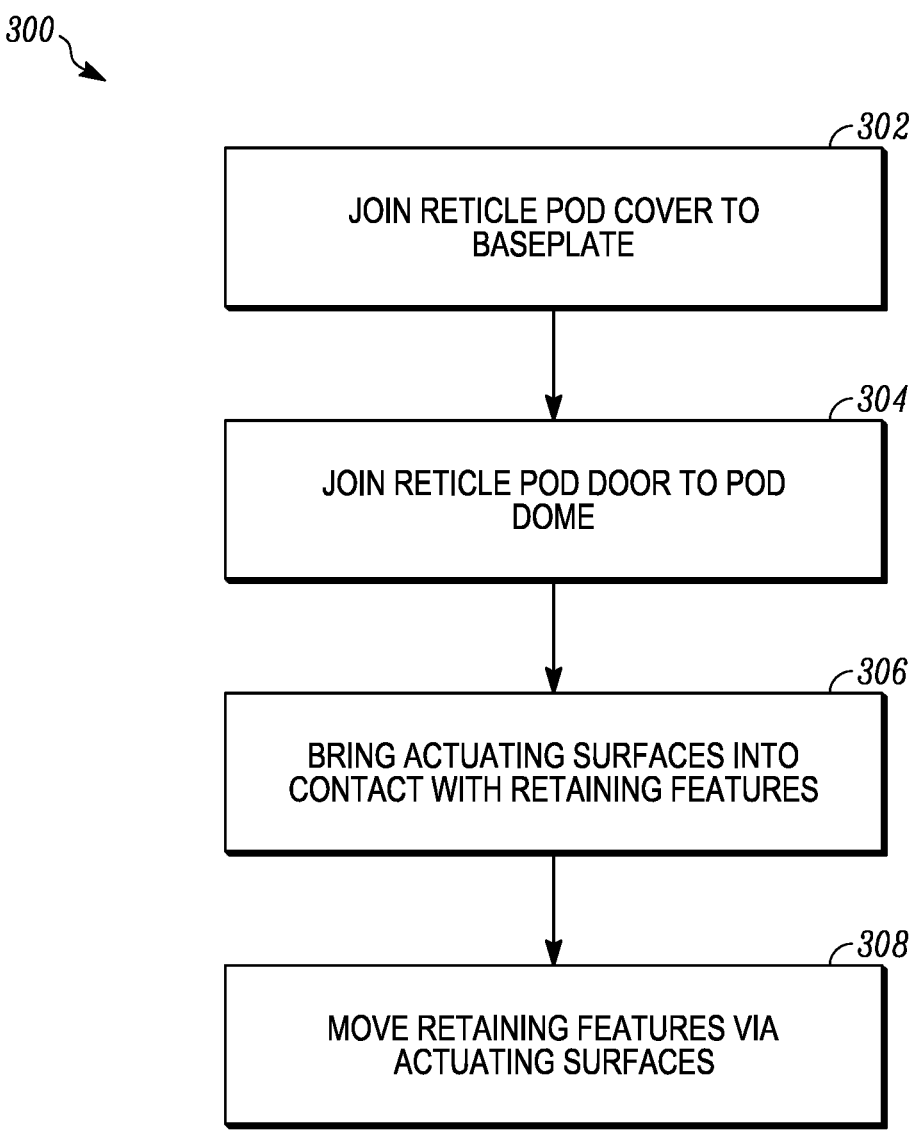
FIG. 3 shows a flowchart of a method for manipulating one or more retaining features, according to an embodiment.

FIG. 3 shows a flowchart of a method for moving one or more reticle contacts according to an embodiment. The method 300 includes joining a cover to a baseplate 302, joining a pod door to the pod dome 304, bringing one or more actuating surfaces into contact with one or more retaining features located on the reticle compartment wall 306, and moving the one or more retaining features via the contact with the one or more actuating surfaces 308.

A cover is joined to a baseplate 302. The cover may be, for example, cover 106 or cover 206 described above. The baseplate may be, for example, baseplate 104 or 204 described above. In an embodiment, a reticle is placed on the baseplate prior to joining the cover to the baseplate at 302. In an embodiment, joining the cover to the baseplate includes placing the cover on the baseplate such that a reticle compartment wall, such as reticle compartment wall 108, rests on the baseplate. In an embodiment, joining the cover to the baseplate includes placing the cover on a reticle compartment wall extending from the baseplate, such as reticle compartment wall 208. Joining the cover to the baseplate 302 may include aligning the cover and the baseplate with one another such that they are in the same orientation. The orientation may be alignment of interfacing features on one or both of the cover and the baseplate.

A pod door is joined to a pod dome 304. The pod door may be, for example, pod door 116 or 216 described above. The pod dome may be, for example, pod dome 114 or 214 described above. The pod door and pod dome may be joined 304 such that the cover and baseplate joined at 302 are contained within the pod dome and pod door. After the pod door is joined to the pod dome 304, the pod door and pod dome may be secured to one another via one or more latches. The pod door and pod dome may be joined 304 by placing the pod dome over the pod door, such that the pod door is within a space defined by the pod dome.

One or more actuating surfaces are brought into contact with one or more retaining features located on the reticle compartment wall 306. The one or more actuating surfaces may be present on the pod dome or the pod door. The one or more actuating surfaces may be configured to contact the retaining features 306 when the pod door and pod dome are joined at 304. The one or more actuating surfaces may be configured to contact the retaining features 306 when the pod dome and pod door are secured via a latch. The actuating surfaces may be, for example, a sliding surface configured to contact a sliding surface on the retaining features. In an embodiment, the sliding surface is included on a projection from the pod dome. The actuating surfaces may be, for example, a contact point configured to contact an end of a retaining feature where it extends outside the reticle compartment wall. In an embodiment, the contact point is on a projection from the pod door.

The one or more retaining features are moved via the contact with the one or more actuating surfaces 308. In an embodiment, the actuating surface drives linear movement of a retaining feature such as, for example, reticle retainer 110 inwards into a space defined by the reticle compartment wall. In an embodiment, the actuating surface is a sliding surface contacting a corresponding sliding surface on the retaining feature such that the retaining feature moves inwards into the space defined by the reticle compartment wall. In an embodiment, the actuating surface drives rotational movement of the one or more retaining features. The rotational movement may be about an axis in plane with a plane of the reticle compartment wall. The rotational movement may cause a reticle contact on the retaining feature to be rotated such that it is moved in a direction having a component towards the baseplate. In an embodiment, the retaining feature includes one end on a first side of the reticle compartment wall, a second end on the opposite side of the reticle compartment wall, and a hinge joining the retaining feature to the reticle compartment wall. The actuating surface presses against one end of the retaining feature, driving rotation about the hinge. Rotation about the hinge causes the second end to be moved, for example, towards the baseplate. When the retaining feature is moved by contact with the actuating surface at 308, the retaining feature may be in a position where it would contact a reticle within the internal space defined by the cover and baseplate. Contact of the retaining feature or features with the reticle may secure the reticle within the reticle pod. The securement of the reticle may further include contact with reticle contacts formed in or attached to the baseplate.

ASPECTS

It is understood that any of aspects 1-14 can be combined with any of aspects 15-20.

Aspect 1. A reticle pod, comprising:

an inner portion including a cover and a baseplate, one of the cover and the baseplate including a reticle compartment wall extending from that one of the cover and the baseplate, the reticle compartment wall including one or more retaining features; and an outer portion including a pod dome and a pod door, one of the pod dome and the pod door including one or more actuating surfaces configured to contact at least one of the one or more retaining features when the cover is joined to the baseplate, the pod dome being joined to the pod door, and the joined cover and baseplate being within the joined pod dome and pod door, wherein when the one or more actuating surfaces contact the one or more retaining features, the retaining features are configured to be positioned such that they are capable of contacting a reticle when the reticle is located within the joined cover and baseplate.

Aspect 2. The reticle pod according to aspect 1, wherein each of the one or more retaining features is linearly movable in a direction having a component with an angle ranging from zero to ninety degrees to a plane of the reticle compartment wall.

Aspect 3. The reticle pod according to aspect 2, wherein each of the one or more retaining features includes a spring.

Aspect 4. The reticle pod according to aspect 3, when the spring is in a resting position, the retaining feature is in a position farther from a center of the baseplate than when the retaining feature is contacted by one of the one or more actuating surfaces.

Aspect 5. The reticle pod according to any of aspects 2-4, wherein each of the one or more retaining features is linearly movable in a direction having an angle ranging from zero to ninety degrees to a plane of the reticle compartment wall.

Aspect 6. The reticle pod according to any of aspects 2-5, wherein each of the one or more retaining features includes a contact surface configured to engage a curved or beveled edge.

Aspect 7. The reticle pod according to any of aspects 2-6, wherein each of the one or more actuating surfaces is a surface configured to slide against an end of at least one of the one or more retaining features.

Aspect 8. The reticle pod according to aspect 7, wherein each of the one or more actuating surfaces extends from the pod dome.

Aspect 9. The reticle pod according to aspect 1, wherein:
each of the one or more retaining features include a first end located on a first side of the reticle compartment wall and a second end on a second side of the reticle compartment wall, the second side of the reticle compartment wall opposite the first side of the reticle compartment wall, and the one or more retaining features are each rotatable about an axis in plane with a plane of the reticle compartment wall.

Aspect 10. The reticle pod according to aspect 9, wherein each of the one or more actuating surfaces is a projection extending from the pod door.

Aspect 11. The reticle pod according to aspect 10, wherein when each of the one or more actuating surfaces contacts at least one of the one or more retaining features at the second end, the first end of each of the one or more retaining features contacts the reticle.

Aspect 12. The reticle pod according to any of aspects 1-11, wherein each of the one or more retaining features includes a thermoplastic material.

Aspect 13. The reticle pod according to any of aspects 1-12, wherein the reticle compartment wall extends from the baseplate.

Aspect 14. The reticle pod according to any of aspects 1-12, wherein the reticle compartment wall extends from the cover.

Aspect 15. A method of manipulating one or more retaining features, comprising: joining a cover to the baseplate, wherein one of the cover and the baseplate includes a reticle compartment wall extending from that one of the cover and the baseplate,
placing the joined cover and baseplate in a pod dome;
joining a pod door to the pod dome, wherein joining the pod door to the pod dome includes bringing one or more actuating surfaces into contact with one or more retaining features located on the reticle compartment wall and moving the one or more retaining features via the contact with the one or more actuating surfaces.

Aspect 16. The method according to aspect 15, wherein moving the one or more retaining features comprises linear movement of the one or more retaining features inwards into a space defined by the reticle compartment wall.

Aspect 17. The method according to aspect 16, wherein the one or more actuating surfaces are located on the cover and configured to slide against an end of at least one of the one or more retaining features.

Aspect 18. The method according to any of aspects 15-17, wherein moving the one or more retaining features comprises rotational movement of the one or more retaining features about an axis in plane with a plane of the reticle compartment wall.

Aspect 19. The method according to aspect 18, wherein the one or more actuating surfaces are projections extending from the pod door.

Aspect 20. The method according to any of aspects 15-19, wherein the reticle compartment wall extends from the cover.

The examples disclosed in this application are to be considered in all respects as illustrative and not limitative. The scope of the disclosure is indicated by the appended claims rather than by the foregoing description; and all changes which come within the meaning and range of equivalency of the claims are intended to be embraced therein.

The invention claimed is:

1. A reticle pod, comprising:
an inner portion including a cover and a baseplate, one of the cover and the baseplate including a reticle compartment wall extending from that one of the cover and the baseplate, the reticle compartment wall including one or more retaining features; and
an outer portion including a pod dome and a pod door, one of the pod dome and the pod door including one or more actuating surfaces configured to contact at least one of the one or more retaining features when the cover is joined to the baseplate, the pod dome being joined to the pod door, and the joined cover and baseplate being within the joined pod dome and pod door, wherein when the one or more actuating surfaces contact the one or more retaining features, the retaining features are configured to be positioned such that they are capable of contacting a reticle when the reticle is located within the joined cover and baseplate; and
wherein each of the one or more retaining features include a first end located on a first side of the reticle compartment wall and a second end on a second side of the reticle compartment wall, the second side of the reticle compartment wall opposite the first side of the reticle compartment wall, and the one or more retaining features are each rotatable about an axis in plane with a plane of the reticle compartment wall.

2. The reticle pod of claim 1, wherein each of the one or more retaining features is linearly movable in a direction having a component with an angle ranging from zero to ninety degrees to a plane of the reticle compartment wall.

3. The reticle pod of claim 2, wherein each of the one or more retaining features includes a spring.

4. The reticle pod of claim 3, wherein when the spring is in a resting position, the retaining feature is in a position farther from a center of the baseplate than when the retaining feature is contacted by one of the one or more actuating surfaces.

5. The reticle pod of claim 2, wherein each of the one or more retaining features is linearly movable in a direction having an angle ranging from zero to ninety degrees to a plane of the reticle compartment wall.

6. The reticle pod of claim 2, wherein each of the one or more retaining features includes a contact surface configured to engage a curved or beveled edge.

7. The reticle pod of claim 2, wherein each of the one or more actuating surfaces is a surface configured to slide against an end of at least one of the one or more retaining features.

8. The reticle pod of claim 7, wherein each of the one or more actuating surfaces extends from the pod dome.

9. The reticle pod of claim 1, wherein each of the one or more actuating surfaces is a projection extending from the pod door.

10. The reticle pod of claim 9, wherein when each of the one or more actuating surfaces contacts at least one of the one or more retaining features at the second end, the first end of each of the one or more retaining features contacts the reticle.

11. The reticle pod of claim 1, wherein each of the one or more retaining features includes a thermoplastic material.

12. The reticle pod of claim 1, wherein the reticle compartment wall extends from the baseplate.

13. The reticle pod of claim 1, wherein the reticle compartment wall extends from the cover.

* * * * *